(12) United States Patent
Pandojirao et al.

(10) Patent No.: US 10,718,962 B2
(45) Date of Patent: Jul. 21, 2020

(54) METHODS OF PATTERNING AND MAKING MASKS FOR THREE-DIMENSIONAL SUBSTRATES

(71) Applicant: Johnson & Johnson Vision Care, Inc., Jacksonville, FL (US)

(72) Inventors: Praveen Pandojirao, Jacksonville, FL (US); James D. Riall, St. Johns, FL (US); Adam Toner, Jacksonville, FL (US); Jeffrey Miller, St. Augustine, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 88 days.

(21) Appl. No.: 15/968,298

(22) Filed: May 1, 2018

(65) Prior Publication Data

US 2018/0246349 A1    Aug. 30, 2018

Related U.S. Application Data

(62) Division of application No. 14/696,108, filed on Apr. 24, 2015, now Pat. No. 9,995,951.

(60) Provisional application No. 61/984,693, filed on Apr. 25, 2014.

(51) Int. Cl.
| | | |
|---|---|---|
| *G02C 11/00* | (2006.01) | |
| *B29D 11/00* | (2006.01) | |
| *C25D 1/10* | (2006.01) | |
| *H05K 3/14* | (2006.01) | |

(52) U.S. Cl.
CPC ........ *G02C 11/10* (2013.01); *B29D 11/00807* (2013.01); *C25D 1/10* (2013.01); *H05K 3/143* (2013.01)

(58) Field of Classification Search
CPC .......................... B29D 11/00865; G02C 7/022
USPC ........................................ 351/159.01, 159.73
See application file for complete search history.

(56) References Cited

U.S. PATENT DOCUMENTS

| | | | |
|---|---|---|---|
| 2,255,440 | A | 9/1941 | Sherman |
| 4,124,672 | A | 11/1978 | Jarsen |
| 2006/0113054 | A1 | 6/2006 | Silvestrini |
| 2010/0276919 | A1 | 11/2010 | Dietemann |
| 2013/0225968 | A1 | 8/2013 | Auvray et al. |
| 2013/0284691 | A1 | 10/2013 | Pandojirao-S |
| 2016/0319421 | A1* | 11/2016 | Mildebrath ........... C23C 14/243 |

OTHER PUBLICATIONS

PCT Search Report for corresponding Application No. PCT/2015/027219, dated Sep. 18, 2015.

* cited by examiner

*Primary Examiner* — Hung X Dang

(57) ABSTRACT

The present invention provides a method of making a mask for patterning a three-dimensional substrate. A mandrel includes a form machined in a surface corresponding to a shape of the substrate. A layer of material is deposited in a first region of the form and a metal layer is deposited in a second region of the form. A portion of the mandrel is subsequently removed. The present invention also provides a method of patterning a three-dimensional substrate with a mask.

15 Claims, 9 Drawing Sheets

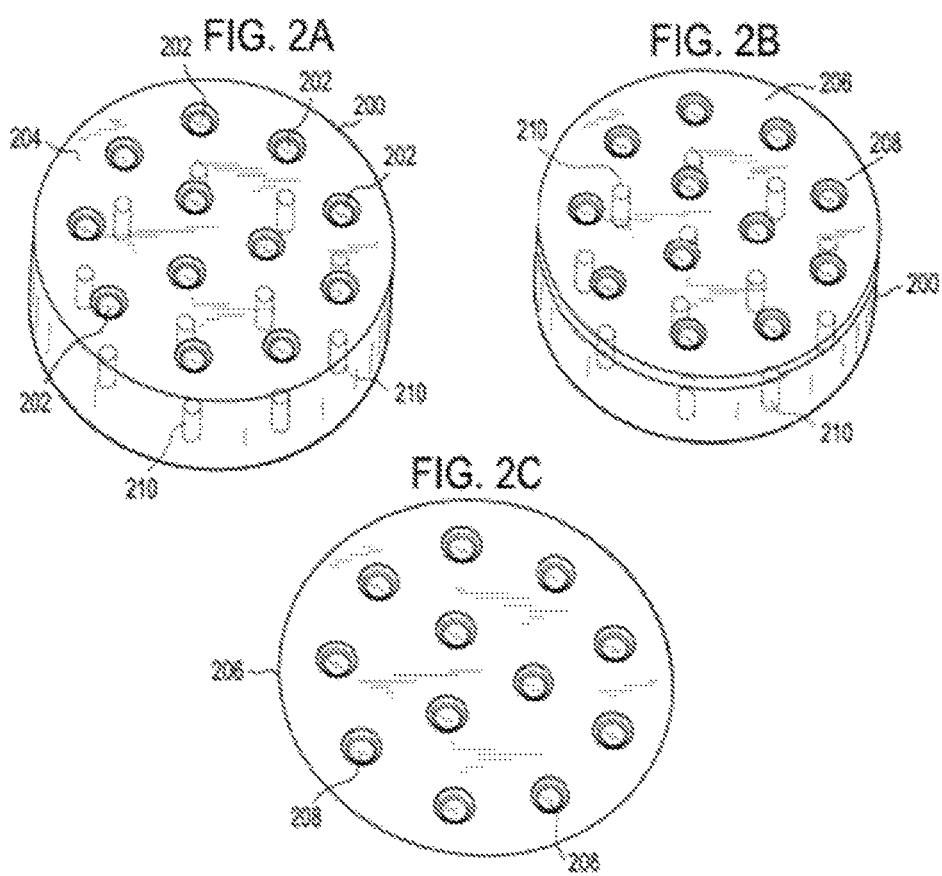

METHODS OF PATTERNING AND MAKING MASKS FOR THREE-DIMENSIONAL SUBSTRATES

CLAIM OF PRIORITY

The present application is a divisional of U.S. patent application Ser. No. 14/696,108 filed on Apr. 24, 2015, now U.S. Pat. No. 9,995,951, which, in turn, claims priority to U.S. Patent Application No. 61/984,693, filed Apr. 25, 2014, the entire contents of which are hereby incorporated by reference.

FIELD OF THE INVENTION

The present invention generally relates to novel methods of patterning three-dimensional substrates with masks and products formed with a deposited, patterned material thereon. The present invention also relates to novel methods of making masks for patterning three-dimensional substrates.

BACKGROUND OF THE INVENTION

Consumer demand in the last decade has spurred technology to further miniaturize electronic devices. Specifically, the trend among consumers to reduce the size and visibility of their electronic devices may relate to their active lifestyles. That is, many consumers wish to carry electronic devices with them at all times at least to stay engaged with the world or to more efficiently track their personal progress. For example, electronic devices are currently employed in medical devices to monitor aspects of body chemistry and administer controlled dosages of medications or therapeutic agents through various mechanisms.

More recently, technology companies have explored the application of microelectronic devices in ophthalmic wearable lenses and contact lenses. Namely, the human eye has the ability to discern millions of colors, adjust easily to shifting light conditions, and transmit signals or information to the brain at rates exceeding high-speed internet connections. By harnessing this knowledge, properly designed lenses incorporating microelectronic devices have the ability to enhance vision and/or correct vision defects. For example, a wearable lens, preferably made of polymers, may include a lens assembly having an electronically adjustable focus to augment or enhance performance of the eye. Various circuits and components are integrated into these polymeric structures to achieve enhanced functionality. These components may include control circuits, microprocessors, communication devices, power supplies, sensors, actuators, light emitting diodes, and miniature antennas.

Electronic and/or powered contact lenses may be designed to provide enhanced vision via zoom-in and zoom-out capabilities. Alternatively, they may modify the refractive, reflective and transmission capabilities of the lenses. Electronic and/or powered contact lenses may also be designed to enhance color and resolution, display textural information, translate speech into captions in real-time, offer visual cues from a navigation system, and provide image processing and internet access, and offer visual enhancement in low-light conditions. The properly designed electronics and/or arrangement of electronics on lenses may further allow an image to be projected onto the retina without a variable focus optic lens. Application may include novel image displays, video, multimedia and wakeup alerts.

Wearable contact lenses may include electronic sensors to detect concentrations of particular chemicals in the precorneal (tear) film. The contact lenses may incorporate components for the noninvasive monitoring of the wearer's biomarkers and health indicators. Sensors built into the lenses may allow diabetics to monitor blood sugar levels by analyzing components of the tear film without having to draw blood. Separately, sensors in the lens may allow monitoring of pH, cholesterol, sodium and potassium levels as well as other biological markers. This could save the patient time and money by eliminating the need to travel to a lab for blood work. In turn, sensors coupled with a wireless data transmitter may allow a physician to have almost immediate access to a patient's blood chemistry.

With endless technological advancements, a number of difficulties exist with incorporating electronic devices on a tiny, optical-grade polymer lens. Namely, it is difficult to manufacture such components directly on the lens due to size constraints. The components need to be integrated on about 1.5 $cm^2$ of polymer. More importantly, the electronic components must be sufficiently distanced from the liquid environment of the eye to prevent contamination. It is also difficult to mount and interconnect planar electronic devices on non-planar lens surfaces. Further, it is also difficult to make a contact lens comfortable for the wearer given the existence of additional electronic components on the lens.

A need therefore exists in the art to form a three-dimensional substrate with precisely deposited layers thereon communicating with microelectronic devices and power sources to form electrical connections.

Another need exists in the art to form a three-dimensional substrate with deposited layers and microelectronic devices thereon safe enough to introduce into an ocular cavity.

A further need exists in the art to form a comfortable three-dimensional substrate with deposited layers and microelectronic devices thereon for purposes of vision correction, vision enhancement and/or monitoring a wearer's biomarkers and health indicators.

SUMMARY OF THE INVENTION

In one aspect of the invention, methods of manufacturing energized biomedical and non-biomedical devices are provided that include steps to promote the controlled adhesion of a rigid insert, a media Insert and/or electronic elements to a hydrogel portion.

In another aspect of the invention, a method of making a mask for patterning a three-dimensional substrate is provided. The method may include a step of providing a mandrel including a form machined in a surface thereof corresponding to a shape of the three-dimensional substrate. A plating layer is deposited in a first region of the form. A metal layer is deposited in a second region of the form, the second region is different from the first region. A portion of the mandrel below the plating layer in the first region and below the metal layer in the second region is then removed.

In yet another aspect of the invention, a method of patterning a three-dimensional substrate with a mask is provided. The method includes a step of overlying the mask on the substrate. The mask includes a first region separated from a second region by a ring-shaped aperture formed along a perimeter thereof. A layer is deposited through the ring-shaped aperture onto the substrate.

In yet another aspect of the invention, a three-dimensional substrate is provided. The substrate includes a lens section and a non-planar section formed outside of the lens section.

Moreover, the substrate includes a ring-shaped layer formed on the non-planar section. The layer has a thickness less than about 100 microns.

There has thus been outlined, rather broadly, certain aspects of the invention in order that the detailed description may be better understood, and in order that the present contribution to the art may be better appreciated. There are, of course, additional aspects of the invention that will be described below and which will illustrate the subject matter of the claims appended hereto.

In this respect, it is to be understood that the invention is not limited in its application to the details of construction and to the arrangements of the components set forth in the following description or illustrated in the drawings. The invention is capable of aspects in addition to those described and of being practiced and carried out in various ways. In addition, it is to be understood that the phraseology and terminology employed herein, as well as the abstract, are for the purpose of description and should not be regarded as limiting.

DESCRIPTION OF THE DRAWINGS

In order to facilitate a fuller understanding of the invention, reference is now made to the accompanying drawings, in which like elements are referenced with like numerals. These drawings should not be construed as limiting the invention and are intended only to be illustrative.

FIGS. 2A, 2B and 2C are diagrammatic representations of a second exemplary mandrel with multiple shadow mask blanks in accordance with the present invention.

DETAILED DESCRIPTION OF THE INVENTION

Figure 1A:
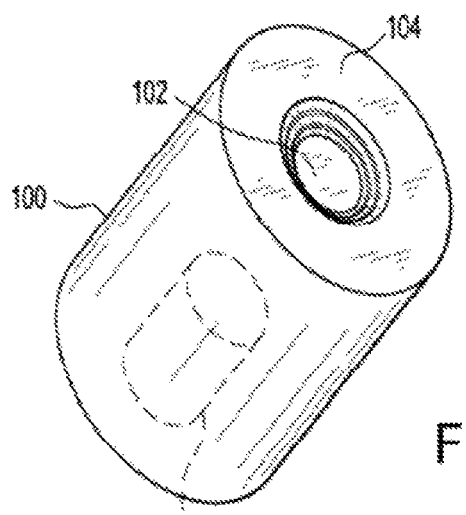
FIGS. 1A, 1B and 1C are diagrammatic representations of a first exemplary mandrel with a single shadow mask blank in accordance with the present invention.

The invention will now be described with reference to the drawings, in which like reference numerals refer to like parts throughout.

Reference in this specification to "one embodiment" or "an aspect," or the like means that a particular feature, structure, or characteristic described in connection with the aspect is included in at least one aspect of the invention. The appearances of, for example, the phrases "one embodiment" or "an aspect" in various places in the specification are not necessarily all referring to the same aspect, nor are separate or alternative aspects mutually exclusive of other aspects. Moreover, various features are described which may be exhibited by some aspects and not by others. Similarly, various requirements are described which may be requirements for some aspects but not by other aspects.

Masks are generally used to deposit precise layers of a material onto specific locations of a substrate located thereunder. Specifically, masks include blocked and unblocked regions to form a predetermined pattern on a surface of a substrate. More specifically, these patterns are useful to form interconnections on rotationally symmetric surfaces and also on non-rotationally symmetric features such as planar surfaces of a three three-dimensional substrate. In accordance with the devices and methods of the present invention described herein, precision masks may be fabricated and subsequently utilized to form interconnect features on complex, non-planar, three-dimensional surfaces used in ophthalmic and medical applications.

In a first aspect of the invention, a method of making a mask for patterning a non-planar substrate is provided. A mandrel is employed to fabricate the mask. A mandrel has plural definitions in the art including but not limited to an object utilized to shape machined work, a tool that holds or otherwise secures materials to be machined and a tool that may be utilized to secure other moving tools. For purposes of this invention, a mandrel is a base form with one or more parts upon which a shadow mask is fabricated. More specifically, the mandrel is the component in or on which one or more shadow masks blanks may be formed.

In an exemplary embodiment, the mandrel is substantially disc or cylindrical shaped. The mandrel includes one or more shafts located at one end that is capable of being attached to a machine lathe or similar device. An opposite planar surface of the mandrel is machined according to a detailed technique wherein the surface roughness is preferably less than about 10 nm. This opposite planar surface of the mandrel may be machined with one or more form wells. Preferably, the well features are less than about 100 microns. More preferably, the well features are less 10 microns. The machined surface of the mandrel, including one or more form wells, substantially matches the internal profile and features of the item(s) to be masked. Preferably, the masked item is a three-dimensional substrate. More preferably, the masked item is a non-planar, three-dimensional substrate. Even more preferably, the masked item is an ophthalmic lens with microelectronic devices located thereon.

Figure 1B:
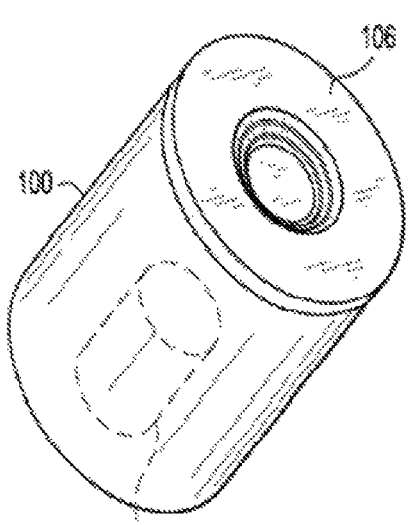
Figure 1C:
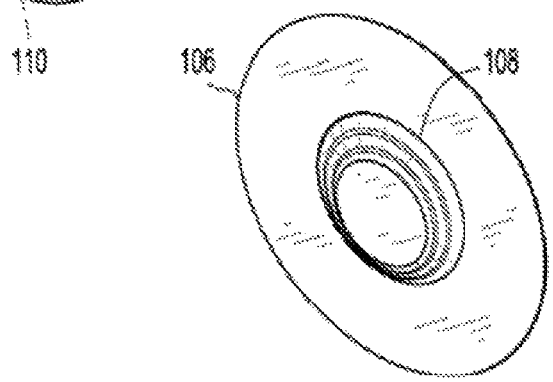

According to one embodiment as shown in FIGS. 1A, 1B and 1C, an exemplary mandrel 100 is shown having a single form or form well 102 machined into one planar face 104 thereof (See FIG. 1A). In FIG. 1B, the exemplary mandrel 100 is illustrated having a shadow mask blank plate 106 that has a single shadow mask blank 108 formed thereon. FIG. 1C illustrates one embodiment of the shadow mask blank plate 106 separated from the mandrel 100. The shadow mask blank 108 may be removed from the shadow mask blank plate 106 to form the shadow mask. In this exemplary embodiment, the mandrel 100 has a substantially cylindrical shape as only a single form 102 is machined therein. An attachment shaft 110 for securing the mandrel 100 to a lathe is illustrated in phantom. In the illustrated exemplary embodiment, the form 102 comprises a number of layers and faces that match the three-dimensional substrate upon which the mask is to be utilized. The mandrel 100 preferably comprises aluminum and the single shadow mask blank 108 preferably comprises nickel. The single shadow mask blank 108 and the shadow mask itself may be fabricated utilizing any suitable processes, including those described herein. Preferably, the thickness of the shadow mask is less than about 100 microns. In addition, the ratio of thickness of the shadow mask to the width of the pattern is less than about 1. In other words, a 100 micron wide pattern necessitates a shadow mask that is about 100 microns or less in thickness. Preferably, the width of the shadow mask is about 100 to 75 microns.

According to another embodiment as shown in FIGS. 2A, 2B and 2C, there is illustrated an exemplary disc shaped mandrel 200 having multiple forms or form wells 202 machined into one planar face 204 thereof (FIG. 2A), the exemplary disc shaped mandrel 200 with a shadow mask blank plate 206 including multiple shadow mask blanks 208 formed thereon (FIG. 2B), and the shadow mask blank plate 206 separated from the mandrel 200 (FIG. 2C). The multiple shadow mask blanks 208 may be removed from the shadow mask blank plate 206 to form the shadow masks utilizing the same process as is utilized to fabricate the masks from the blanks, for example, laser machining. In this exemplary embodiment, the mandrel 200 has a substantially disc shape to accommodate the multiple forms 202 machined therein. The size of the forms 202, the number of forms 202 and the size of the mandrel 200 are all related to or dependent on one another. The multiple forms 202 may be arranged in any suitable configuration. An attachment shaft 210 for securing the mandrel 200 to a lathe, illustrated in phantom, is centered behind the opposite planar face of each of the forms 202.

In the illustrated exemplary embodiment of FIG. 2A, the forms 202 each comprise identical patterns of layers and faces that match the three-dimensional substrate in which the masks are to be utilized; however, different forms may be utilized on a single mandrel. Once again, the mandrel 200 preferably comprises aluminum and the multiple shadow mask blanks 208 preferably comprise nickel. The shadow mask blanks 208 and the shadow masks themselves may be fabricated utilizing any suitable process, including those described herein.

Figure 3A:
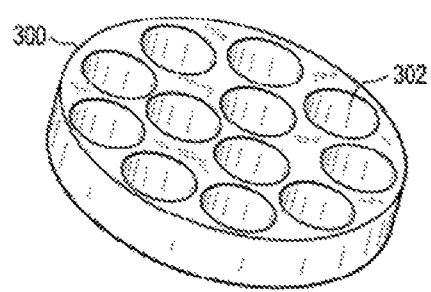
FIGS. 3A, 3B, 3C and 3D are diagrammatic representations of an exemplary mandrel assembly with multiple shadow mask blanks in accordance with the present invention.
Figure 3B:
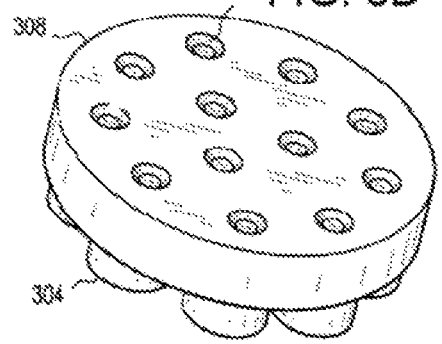
Figure 3C:
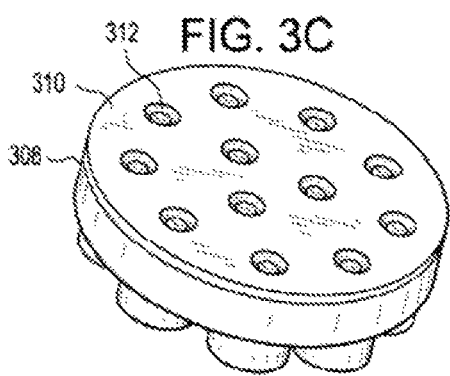
Figure 3D:
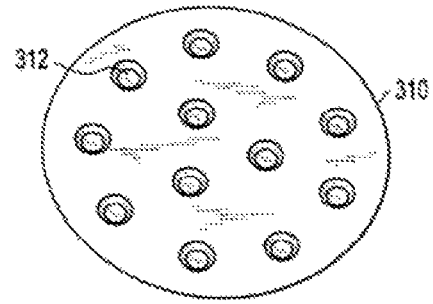

In accordance with an alternate exemplary embodiment as shown in FIG. 3A, there is illustrated a disc shaped structure 300 with plural openings 302 located therethrough. This substantially disc shaped structure 300 may be fabricated from any number of materials, including aluminum, as described above. The through-hole openings 302 are sized to accept single mandrel structures 304 with a single form or form well 306 therein. FIG. 3B illustrates the combination of the substantially disc shaped structure 300 (shown in FIG. 3A) and a plurality of the single mandrel structures 304 form a mandrel assembly 308. The single mandrel structure 304 and the substantially disc shaped structure 300 may comprise any suitable means for removably attaching to one another, for example, via threads. By having the elements interconnected in this manner, various forms 306 may be incorporated into a single mandrel assembly 308. FIG. 3C illustrates the mandrel assembly 308 with a shadow mask blank plate 310 and associated shadow mask blanks 312. FIG. 3D illustrates the shadow mask blank plate 310 separated from the mandrel assembly 308.

As shown in FIGS. 1-3, the one or more well forms are generally symmetric. Specifically, a rotating tool attaches to the one or more shafts in the mandrel coinciding with the center of the one or more well forms. The mandrel is preferably a lightweight material to ensure less movement when machining a form. The mandrel also is capable of withstanding the stresses, strains and wear of repeated uses. In an exemplary embodiment, the mandrel is fabricated from a lightweight, high strength to weight ratio and relatively inexpensive metallic material. Preferably, this material is aluminum because of its malleability and ability to be chemically dissolved. By so doing a well form replicating the internal profile of the three-dimensional substrate can be obtained.

Any process known to those skilled in the art can be employed to machine the well form. For example, a lathe or other turning machine, such as a turn-mill and a rotary transfer, may be equipped with natural or synthetic diamond tipped tools to fabricate the one or more forms. This process is conventionally known as diamond point turning. Diamond point turning is a multi-stage process, wherein the initial stages of machining are carried out utilizing a series of computer numerical control lathes. Each successive lathe in the series is more accurate than the last. In the final step of the series, a diamond tipped tool is utilized to achieve sub-nanometer level surface finishes and sub-micron form accuracies.

Alternatively, the one or more well forms may be created utilizing electro discharge machining. Generally, electro discharge machining is a manufacturing process wherein a predetermined shape is obtained utilizing electrical discharges to remove material, thereby creating the predetermined shape or form. In an exemplary embodiment, the well that is machined in the mandrel will be substantially identical to a mold of a three-dimensional substrate to be masked. The well may include planar and non-planar surfaces. For example, a planar surface may reside in the well to be consistent with a planar area located on the substrate to accommodate electronic components including but not limited to dies, batteries and electrodes.

Figures 4A, 4B, 4C:
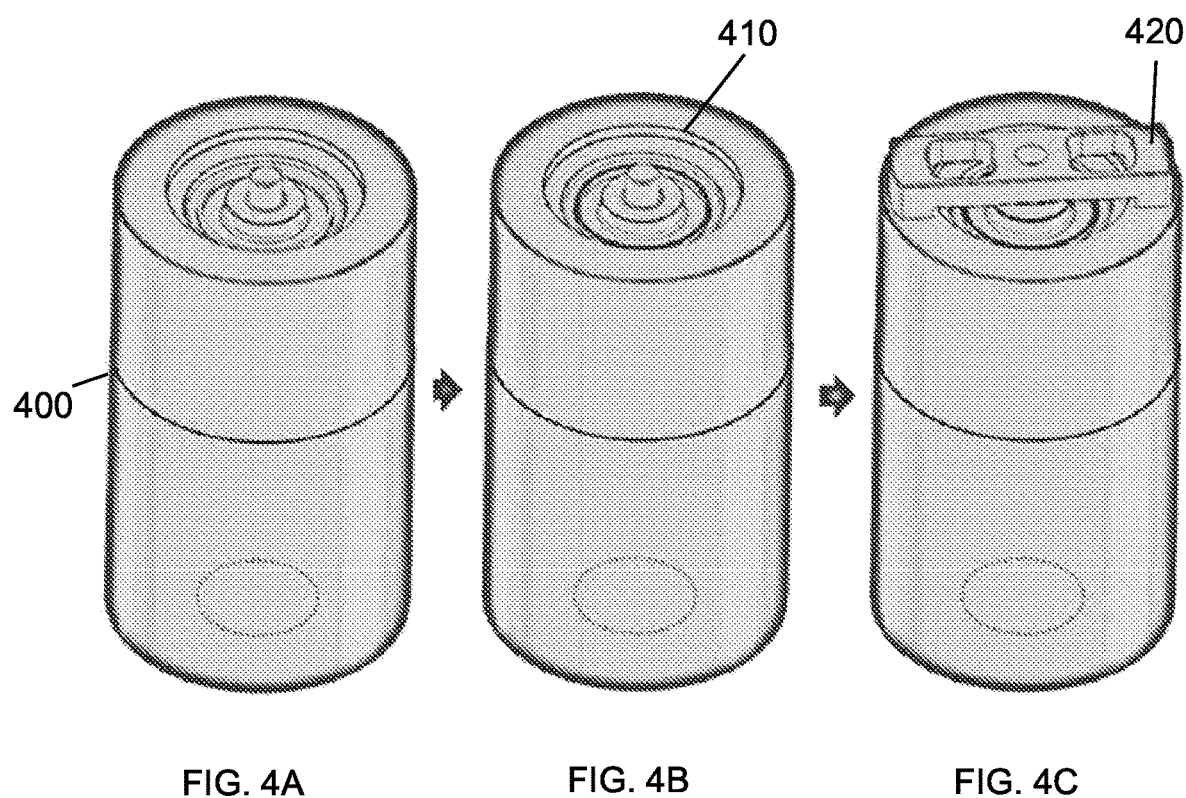
FIGS. 4A, 4B and 4C are diagrammatic representations of an exemplary technique for fabricating a hybrid deposition mask which incorporates an epoxy/plating mask in a machined well of a mandrel and a bridge component disposed above a mandrel in accordance with the present invention.

In another embodiment, and after the well form has been machined in the mandrel 400 as shown in FIG. 4A, a plating mask layer 410 is deposited in the well as shown in FIG. 4B. Preferably, the plating mask comprises a non-metallic material. In an exemplary embodiment, the non-metallic material comprises epoxy. In addition, any material can be employed so long as it does not interfere with the nickel plating process. Specifically, the layer is formed in a first region of the form. The first region may be formed around the perimeter of the form. Preferably, it is a 360-degree circle around the form in the shape of a ring. The deposited layer can preferably range from as thick as the shadow mask to a few atomic layers. Preferably, the thickness of the deposited layer is less than or equal to 100 microns. In addition, the width of the deposited layer is preferably less than or equal to 100 microns. During a subsequent masking process for a three-dimensional substrate, as discussed in more detail below, the area where epoxy is located is used to deposit and pattern a material on a specific location on a three-dimensional substrate. The shadow masks are reusable. For example, in one embodiment, the shadow mask may be used for a plurality of depositions up to several hundred. In a further embodiment, the shadow mask can be cleaned and used indefinitely.

In yet another embodiment, the shadow mask includes a bridge component 420 as illustrated in FIG. 4C. Preferably, the bridge is a single, unitary structure. The bridge may be formed of any material. Preferably, the bridge is formed from the same material as the mandrel. The bridge includes upper and lower planar surfaces. The bridge is disposed substantially above the machined form located in the mandrel. It is possible for sections of the bridge to intersect the opening in the form. In an exemplary embodiment, the bridge includes a horizontal main body that is perpendicular to an axial direction of the mandrel. Preferably, the height of the bridge is designed such that it does not hinder the patterning/deposition process. The bridge and mandrel are designed to maintain its integrity and usability of parts after the aluminum is dissolved.

Figure 5:
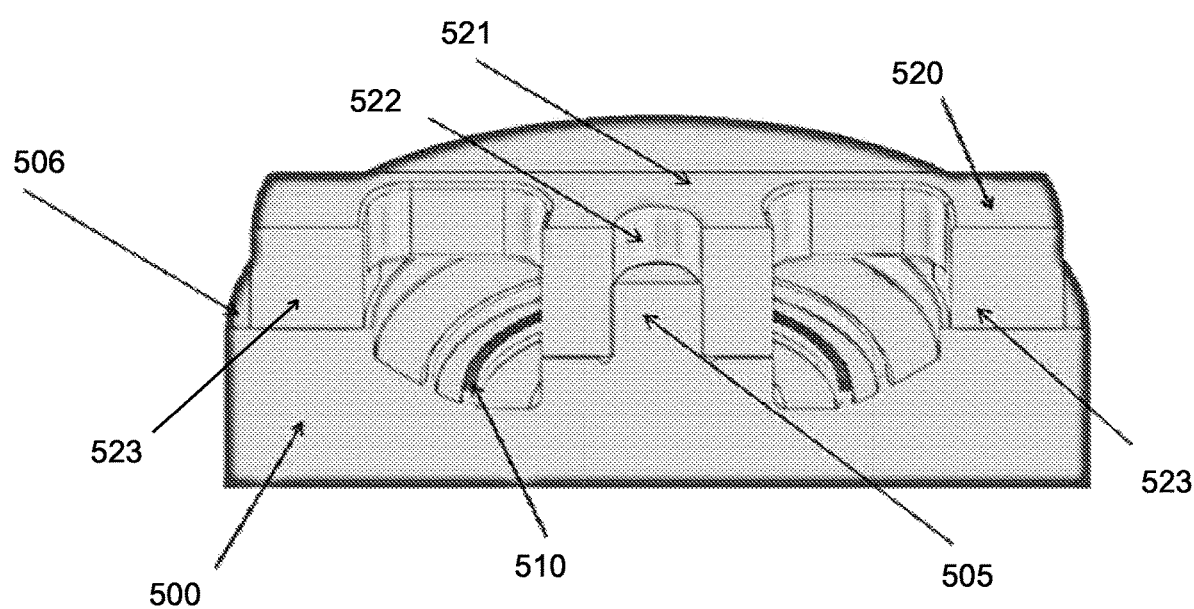
FIG. 5 is a cross-sectional view of the mandrel and bridge of FIG. 4C.

A cross sectional view of the mandrel and bridge is shown in FIG. 5. The main body 521 of the bridge includes one or more apertures. The apertures allow more efficient coating of the parts in a subsequent step. Preferably, the main body 521 includes a central opening 522 located directly above a central portion of the mandrel. A raised portion 505 of the mandrel located in the machined well, preferably formed by machining, projects upward in the axial direction along a central portion of the mandrel. Preferably, the central opening 522 of the bridge, e.g., female portion, is configured to mate with the raised portion 505 of the machined well, e.g., male portion, to form a secure attachment.

The bridge also includes legs 523 located at opposite ends of the main body. The legs 523 extend in the axial direction of the mandrel 500 from a lower surface of the main body 521 of the bridge 520 toward an upper planar surface of the mandrel 500 located adjacent to the machined well. Preferably, a lower surface of each of the legs 523 abuts an upper planar surface 506 of the mandrel 500. In an exemplary embodiment, the bridge 520 comprises two legs 523 equidistantly separated from the central opening 522 and directly across from one another, e.g., 180 degrees apart.

In a further embodiment, one or more shadow mask blanks are formed in the form(s) of the mandrel and over the bridge via an electroplating or electroforming process. Namely, shadow mask blanks are precursors to final masks which are used to pattern three-dimensional substrates. That is, they replicate the shape of the form which in turn replicates the shape of the three-dimensional substrate that is subsequently masked. Namely, the form is overlaid on the three-dimensional substrate having a substantially identical match. A close overlaid design is preferred to ensure optimal deposition onto the substrate. Imperfections in the form may cause deposition of material under the mask onto undesired areas of the substrate. By so doing, capacitance and other electrical properties of electronic devices formed on the substrate may be compromised. It may also affect the transmission, reflection and scattering properties of an optically clear or opaque pattern.

There are many metallic materials which may be used to fabricate the shadow mask blanks. In an exemplary embodiment, the shadow mask blank is fabricated from nickel. Preferably, the deposited metal has a thickness less than about 100 microns. Generally, the ratio of the thickness of the shadow mask to the width of the pattern is less than or equal to about 1. Thus, a 100 micron wide pattern will necessitate a shadow mask with a thickness of 100 microns or less. Preferably, the thickness of the shadow mask is about 75 to 100 microns. It is noted, however, that the thickness of the shadow mask blank may vary depending on the application.

The process to form the shadow mask blank may change from electroforming to another suitable process. Electroforming is a well-known metal forming process wherein thin parts are fabricated utilizing an electroplating process. Electroforming is employed in instances where the part to be fabricated has extreme tolerances or complexity. Electroplating is a process in which metal ions in a solution are moved by an electric field to coat or plate a metal skin onto a base which is then removed after plating is complete. Because of the nature of the process, high fidelity structures may be produced with this technique. In other words, electroforming reproduces the form exactly without any shrinkage or distortion.

In an exemplary embodiment, the thickness of the deposited metal layer is less than about 100 microns. The resulting mask is superposed onto the three-dimensional substrate for patterning one or more additional layers. Preferably, the mask is superposed in a manner such that there is less than about 5 microns from a front optic disposed on the substrate. Reduced thickness of the mask relates to an improved dimensional control of the deposited layer on the substrate which, as will be discussed below in more detail, reduces capacitance between electrical components formed on the substrate.

Figure 6:
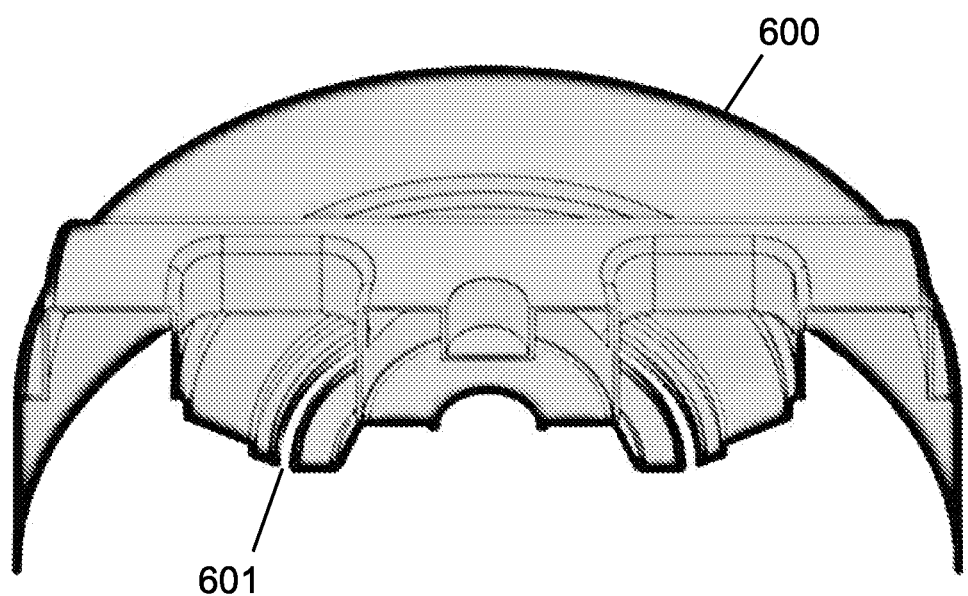
FIG. 6 is a cross-sectional view of an exemplary shadow mask in accordance with the present invention.

In a further embodiment as illustrated in FIG. 6, the deposited metal is applied over the top planar surface of the mandrel, inside the machined well and over the bridge. In an exemplary embodiment, the metal layer is applied to a second region of the form. The deposited metal is selectively applied inside the machined well along surfaces, and regions, different from the first region of the form where the plating layer is deposited. More preferably, the deposited metal in the second region is adjacent to the deposited plating layer in a first region. As shown in FIG. 6, the plating layer is removed as discussed in more detail below according to a subsequent step of the mask forming process.

The shadow mask blank formed by the upper portion of the mandrel and bridge (and epoxy/plating mask) is then removed from the remaining portion of the mandrel. The shadow mask blank may be removed in a number of ways including, for example, chemical or physical separation. In one embodiment, the mandrel portion below the shadow mask blank is chemically dissolved. Preferably, less than 100 microns of aluminum below the metal layer and plating layer remains after the dissolving process. More preferably, all of the aluminum of the mandrel below the metal layer and plating is dissolved. In another embodiment, the shadow mask blanks are physically separated from the mandrel manually or via robotic manipulators and placed in a fixture for further processing.

In a further embodiment, after the shadow mask has been removed from the mandrel, the plating mask is removed from the shadow mask. In an exemplary embodiment, the plating mask is separated from the metal layer. Preferably, removal of the epoxy plating mask is performed by a thermal process. For instance, the epoxy may be vaporized or degraded to facilitate easy removal via peeling. Chemical or plasma type etching can also be used as long as the etching process does not affect the mask material. By so doing, an aperture 601 is formed in the shadow mask having a ring shape around the perimeter of the mask. This aperture is identical and consistent with the area where the epoxy plating mask was originally deposited. A cross-section of the mask 600 is shown in FIG. 6. As illustrated, the thickness of the shadow mask is less than or equal to about 100 microns. As illustrated in FIG. 6, the bridge component can be useful for securing the upper portion of the mandrel thereto in view of removing the ring-shaped plating mask.

In yet a further embodiment, the mask may be processed with desired patterns. The desired pattern corresponds to the particular application, for example, electrical interconnects. The pattern may be formed in any suitable manner utilizing, for example, laser machining, laser ablation, and/or chemical etching. In an exemplary embodiment, the pattern is formed in the shadow mask blank by laser micromachining. Accordingly, once the shadow mask blanks are removed from the mandrel, they are placed on a holding fixture that is compatible with the laser machining system. The precision of currently available laser systems makes the micromachining of extremely intricate patterns possible.

Figure 7:
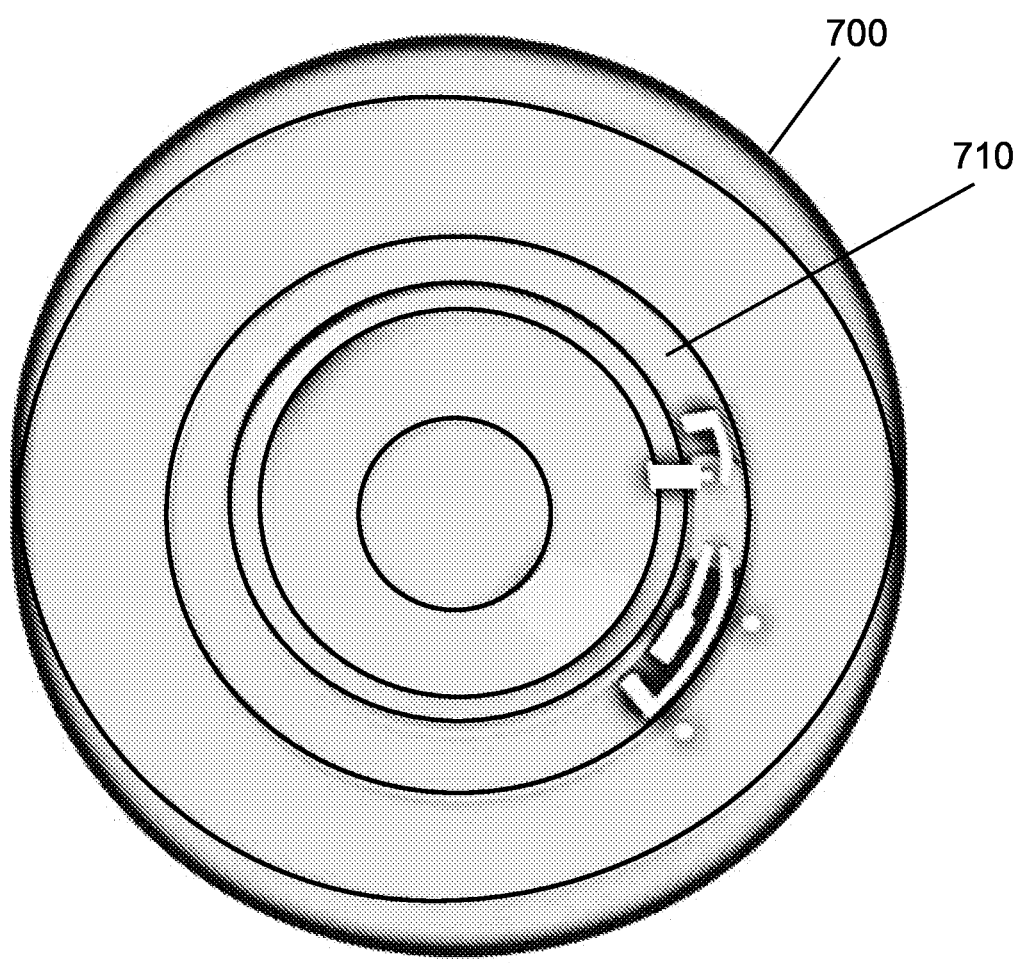
FIG. 7 is a diagrammatic representation of an exemplary shadow mask including a machined planar surface for accommodating electronic components on a substrate to be masked in accordance with the present invention.

In yet another embodiment, the machined well in the mandrel, as discussed above, may be machined to include a non-rotationally symmetric region. As shown in FIG. 7, the mask 700 includes a planar area 710, e.g., flat region, to accommodate an electronic device such as a die, semiconductor or electrodes. The planar area assists in providing a faster connection and response between electrical components. Alignment features may also be built into the mandrel and shadow mask so that it can be used in automated assembly and manufacturing processes.

According to a further aspect of the present invention, a method of patterning a layer on a three-dimensional substrate is provided. For instance the completed masks are transferred from the laser micromachining fixture to a temporary securement to the substrate that is to be masked to create a final product. For example, if the final product is to be utilized as the substrate for electrical interconnects on an insert for a powered contact lens, then the shadow mask may be secured to the front optic by a specialized fixture that would allow for the interconnect material to be deposited onto the substrate through the openings in the shadow mask. In an exemplary embodiment, the material to be deposited would pass through the 360-degree, ring-shaped aperture formed in the shadow mask. Any suitable deposition process known to those skilled in the art may be utilized so long as it is compatible with the substrate.

In an exemplary embodiment, the three-dimensional substrate is non-planar. More preferably, the substrate is substantially non-planar. There are numerous ways to produce a three-dimensional substrate. In some exemplary embodiments, an injection molding technique may be used to form the object. Other exemplary embodiments may be defined by forming various materials, like plastic films, where thermal heating of plastic sheets and pressure from mold forming parts form the plastic sheets into three-dimensional shapes. Other exemplary embodiments may involve the stamping of metallic films or electroforming of metallic materials into three-dimensional shapes, for example, and then coating such a product with an insulating material so that discrete electrical interconnects may be formed thereon. Other processes that may form three dimensionally shaped products like stereo lithography and voxel-based lithography can be suitable. It may be apparent to one skilled in the art that any method that defines a three-dimensional shape which is either made of an electrically insulative material or may be coated with an electrically insulative material can be suitable.

Figure 8:
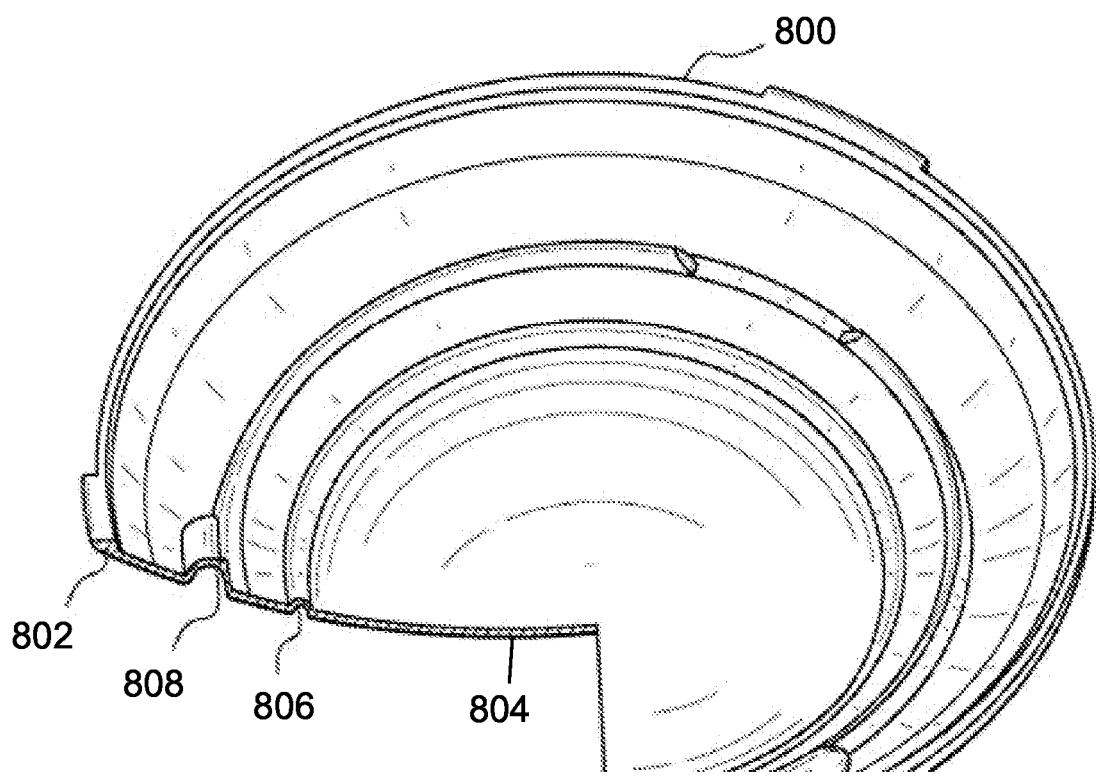
FIG. 8 is a diagrammatic representation of an exemplary three-dimensional substrate with surfaces upon which interconnections may be configured utilizing a mask in accordance with the present invention.

In an exemplary embodiment as shown in FIG. 8, a substrate 800, such as an ophthalmic lens, is provided. FIG. 8 illustrates a number of attributes of the three-dimensional aspect of the substrate 800 by depicting a cross-sectional cut across a portion of the substrate 800. The substrate 800 comprises an outer portion or edge 802, a central portion or central zone 804, and intermediate features 806 and 808. As shown, each of these intermediate features 806 and 808 has their own localized three-dimensional topology.

In ophthalmic lens applications, the difference in height from the edge 802 to the central zone 804 may be up to four (4) millimeters, and the intermediate features 806 and 808 may have localized height differences that vary between 0.001 to 0.5 millimeters with the slopes of the sidewalls thereof varying from about two (2) to about ninety (90) degrees.

A mask, is overlaid, or superposed, over the three-dimensional substrate. Any shadow mask fabricated in accordance with the present invention can be employed to conform to the precise shape of the substrate 800. In other words, a shadow mask prepared in accordance with the present invention should precisely conform to the shape of the substrate and be positioned as close, surface-to-surface, to the substrate as possible. Preferably there is less than about 15 nm of error between the overlaid mask and a front optic located on a planar area of the substantially non-planar substrate. Specifically, when there is space between the mask and the substrate, the depositing material may not be limited to the sharp edges defined in the mask. Rather the material may spread out to features proximate to the mask's defined features. In some instances, where parallel lines are placed in proximity to each other, electrical shorting between these features may result when the deposited features are not sharply defined.

After the mask has been aligned and placed upon its substantially matched, three-dimensional substrate, the shadow mask deposition process may be performed. There are many deposition techniques which may be used here for thin film formation. For example, sputter deposition may be employed. A plurality of films may also be used. For example, the films may include metallic films, dielectric films, high-k dielectric films, conductive and non-conductive epoxies and other conductive and non-conductive films. For instance, gold, transparent conductive materials (such as ITO), dielectric (such as silicon nitride, silicon dioxide, etc.) may be used. In a preferred embodiment, gold is used. Furthermore, in each of these categories, there may be a wide diversity of consistent materials that can be used in the formation of useful films within the scope of this art. Without limiting this general scope, some materials of particular interest may include Indium Tin Oxide (ITO), Graphene, carbon nanoparticles and nanofibers.

After the deposition step, a film with an appropriate thickness is formed in a predetermined location on the substrate. A resulting product of a substrate with directly formed interconnections is realized. According to trials, the capacitance of the interconnect features is less than 70 picofarads. More preferably, the capacitance is less than about 50 picofarads. In a preferred embodiment, the capacitance is less than about 20 picofarads. This effect is realized by the precision of the ring-shaped 360-degree deposited layer on the substrate.

In yet a further embodiment, after the conductive layers, e.g., traces, have been defined, laser ablation processing may again be employed. If the conductive traces or interconnect features defined by a shadow mask are not of a precision that may be obtained with laser ablation, the defined conductive traces or interconnect features may be "trimmed" or further defined through the use of laser ablation. In some exemplary embodiments, such trimming may result in improvements in throughput, since features very close to the desired finished product may be formed by shadow masking and then changed in small manners by laser ablation.

An exemplary powered or electronic contact lens comprises the necessary elements to correct and/or enhance the vision of patients with one or more vision defects or otherwise perform a useful ophthalmic function. In addition, the lens may be utilized simply to enhance normal vision or provide a wide variety of functionality. The electronic contact lens may comprise a variable focus optic lens, an assembled front optic embedded into a contact lens or just simply embedding electronics without a lens for any suitable functionality. The exemplary electronic lens may be incorporated into any number of contact lenses.

Figure 9:
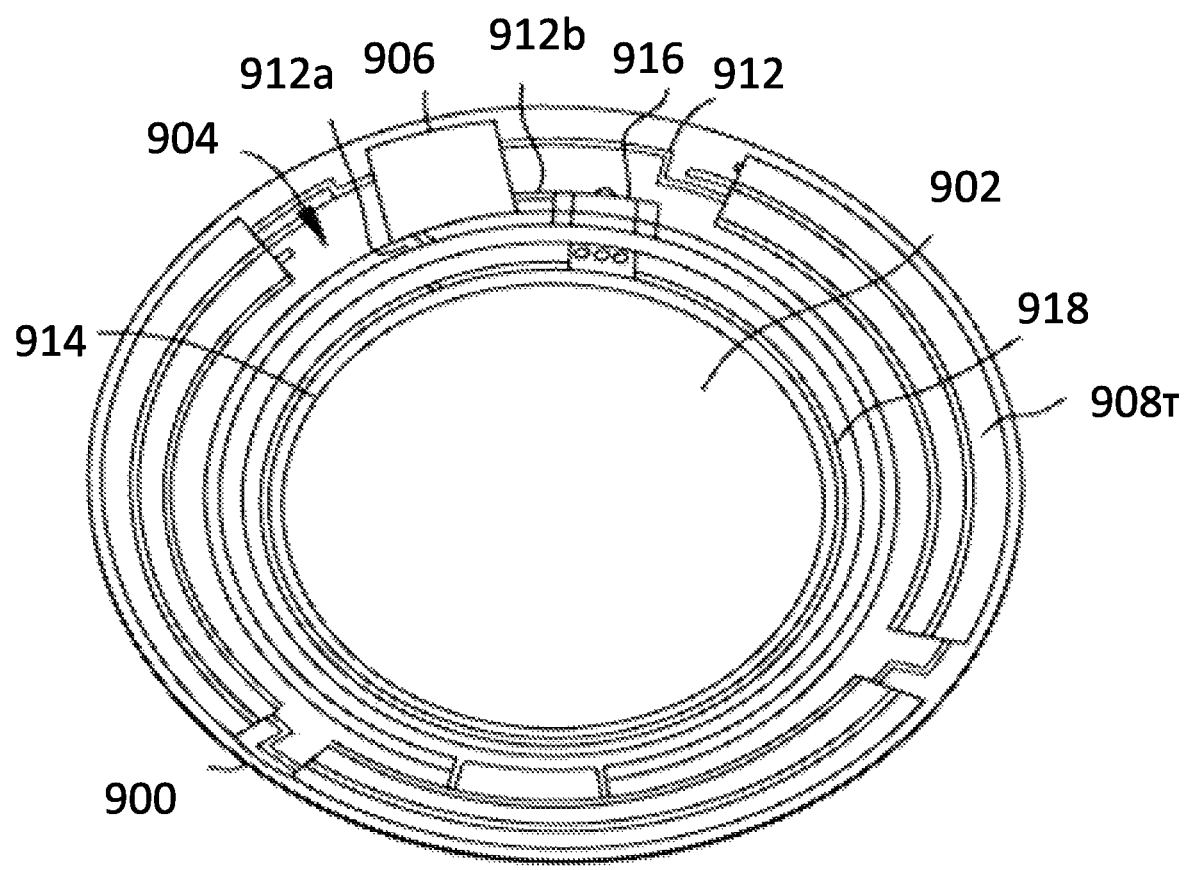
FIG. 9 is a diagrammatic representation of an exemplary contact lens comprising both optics and electronics.

According to FIG. 9, an exemplary contact lens 900 is illustrated that comprises both optical and electronic components such that electrical and mechanical interconnects are required. The contact lens 900 comprises an optic zone 902 that may or may not be functional to provide vision correction and/or enhancement, or alternately, it may simply serve as a substrate for the embedded electronics for any suitable functionality. In the illustrated exemplary embodiment, the polymer or plastic forming the optic zone 902 is extended such that it forms a substrate 904 upon which the electronics are attached. Electronic components, such as semiconductor die 906 and batteries 908, connect both mechanically and electrically to the substrate 904. These electronic components may include functional blocks including a digital control system, a lens driver, a means to provide bias to the other circuits or blocks in the die. An optical sensor may also be included responsive to visible, infrared and/or other form of electromagnetic radiation.

Conductive traces 912 electrically interconnect the electronic components, such as the semiconductor die 906 and the batteries 908, on the substrate 904. In the exemplary embodiment illustrated, a first conductive trace 912a connects semiconductor die 906 to the front optic electrode 914, and a second conductive trace 912b connects semiconductor die 906 to the back optic electrode 916. An adhesive layer 918 may be utilized to connect the front and back optics. The conductive traces 912 described above are preferably fabricated utilizing the mask and masking techniques described herein. As discussed above, the deposited layer forming the conductive trace may be ring-shaped 360 degrees around the perimeter of the substrate.

Although the invention is shown and described in what is believed to be the most practical and preferred embodiments, it is apparent that departures from the specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. A method of patterning a three-dimensional substrate with a mask, the method comprising:
   providing the three-dimensional substrate;
   providing a pre-formed mask comprising:
   a first region separated from a second region by an aperture, and
   a three-dimensional surface that matches the three-dimensional contour of the substrate;
      overlaying the mask on the substrate; and
      depositing a layer through the aperture onto the three-dimensional substrate.

2. The method of claim 1, wherein a width of the aperture is less than about 100 microns.

3. The method of claim 1, wherein a thickness of the mask is less than about 100 microns.

4. The method of claim 1, wherein the layer is selected from a metal, a dielectric, an alloy and combinations thereof.

5. The method of claim 1, wherein the three-dimensional substrate is substantially non-planar.

6. The method of claim 5, wherein the three-dimensional substrate includes a planar region for mounting an electronic device.

7. The method of claim 1, wherein the three-dimensional substrate is an ophthalmic lens.

8. The method of claim 1, wherein the depositing of the layer further comprises depositing one or more conductive traces, through the aperture.

9. The method of claim 8, wherein the depositing the one or more conductive traces comprises depositing a ring-shaped 360-degree conductive trace along a perimeter of the first region.

10. The method of claim 9, wherein the depositing of the layer further comprises precisely depositing the ring-shaped 360-degree conductive trace such that the capacitance of the conductive traces is less than 70 picofarads.

11. The method of claim 10, wherein the capacitance of the conductive traces is less than 50 picofarads.

12. The method of claim 10, wherein the capacitance of the conductive traces is less than 20 picofarads.

13. The method of claim 10, further comprising using laser ablation to trim the deposited one or more conductive traces to achieve the capacitance.

14. The method of claim 1, wherein the overlaying of the mask on the substrate comprises temporarily securing the mask to the substrate by a specialized fixture configured to allow the layer to be deposited on the substrate through the aperture.

15. The method of claim 1, wherein the overlaying of the mask comprises placing the mask onto the substrate such that a space between the overlaid mask and the substrate is less than about 15 nm.

* * * * *